US012456715B2

(12) United States Patent
Lin et al.

(10) Patent No.: US 12,456,715 B2
(45) Date of Patent: Oct. 28, 2025

(54) ELECTRONIC DEVICE WITH DISPLAY MODULE AND DISPLAY MODULE THEREOF

(71) Applicant: Wistron Corporation, New Taipei (TW)

(72) Inventors: Chiu-Yen Lin, New Taipei (TW); Hua-Min Tseng, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 392 days.

(21) Appl. No.: 18/182,686

(22) Filed: Mar. 13, 2023

(65) Prior Publication Data

US 2024/0186299 A1 Jun. 6, 2024

(30) Foreign Application Priority Data

Dec. 1, 2022 (TW) .................................. 111146249

(51) Int. Cl.
*H01L 25/075* (2006.01)
*A61L 2/10* (2006.01)
*A61L 2/26* (2006.01)
*H10H 20/841* (2025.01)

(52) U.S. Cl.
CPC ............ *H01L 25/0756* (2013.01); *A61L 2/10* (2013.01); *A61L 2/26* (2013.01); *H01L 25/0753* (2013.01); *A61L 2202/11* (2013.01); *H10H 20/841* (2025.01)

(58) Field of Classification Search
CPC ............ H01L 25/0756; H01L 25/0753; H10H 20/841; A61L 2/10; A61L 2/26; A61L 2202/11

See application file for complete search history.

(56) References Cited

U.S. PATENT DOCUMENTS

2022/0367766 A1\* 11/2022 Her .......................... G09G 3/32

FOREIGN PATENT DOCUMENTS

TW 1737284 \* 4/2020
TW 202142273 A 11/2021

OTHER PUBLICATIONS

Examination report dated Aug. 29, 2023, listed in related Taiwan patent application No. 111146249.

\* cited by examiner

*Primary Examiner* — Timor Karimy
(74) *Attorney, Agent, or Firm* — McClure, Qualey & Rodack, LLP

(57) ABSTRACT

An electronic device with a display module includes a device body and a display module. The display module is connected to the device body. The display module includes a housing, a protective layer, a transparent substrate, a plurality of visible-light light-emitting diodes, and an ultraviolet light assembly. The protective layer is disposed on the housing. An accommodating space is disposed between the housing and the protective layer. The transparent substrate has a first surface and a second surface opposite to each other. The visible-light light-emitting diodes are two-dimensionally disposed on the first surface. The ultraviolet light assembly is disposed on the second surface. The transparent substrate, the visible-light light-emitting diodes, and the ultraviolet light assembly are disposed in the accommodating space, and the ultraviolet light assembly emits an ultraviolet light toward the protective layer selectively.

20 Claims, 7 Drawing Sheets

ELECTRONIC DEVICE WITH DISPLAY MODULE AND DISPLAY MODULE THEREOF

CROSS-REFERENCE TO RELATED APPLICATION

This non-provisional application claims priority under 35 U.S.C. § 119(a) to Patent Application No. 111146249 filed in Taiwan, R.O.C. on Dec. 1, 2022, the entire contents of which are hereby incorporated by reference.

BACKGROUND

Technical Field

The present invention relates to an electronic device with a display module and a display module thereof, and in particular, to an electronic device with a display module including an ultraviolet light-emitting assembly.

Related Art

Since bacteria or viruses on hands of a user who operates an electronic device may adhere to the electronic device (for example, to a touch screen or an operating member), another user may contact the bacteria or the viruses on the electronic device when operating the electronic device, resulting in spread of the bacteria and the viruses. Therefore, the electronic device needs to be disinfected. In an existing disinfection and sterilization technology, the electronic device may be cleaned with a disinfectant (such as alcohol or a hypochlorous liquid), and may be disinfected and sterilized with a handheld ultraviolet lamp. However, the above sterilization methods all require manual disinfection, which increases the labor costs and may lead to further spread of the bacteria or the viruses due to a disinfection failure of a cleaning person. Therefore, the current disinfection methods for an electronic device needs to be improved.

SUMMARY

In view of this, in some embodiments, an electronic device with a display module includes a device body and a display module. The display module is connected to the device body. The display module includes a housing, a protective layer, a transparent substrate, a plurality of visible-light light-emitting diodes, and an ultraviolet light assembly. The protective layer is disposed on the housing. An accommodating space is disposed between the housing and the protective layer. The transparent substrate has a first surface and a second surface opposite to each other. The visible-light light-emitting diodes are two-dimensionally disposed on the first surface. The ultraviolet light assembly is disposed on the second surface. The transparent substrate, the visible-light light-emitting diodes, and the ultraviolet light assembly are disposed in the accommodating space, and the ultraviolet light assembly emits an ultraviolet light toward the protective layer selectively.

In some embodiments, the protective layer is adjacent to the ultraviolet light assembly, the visible-light light-emitting diodes emit a visible light selectively, and the transparent substrate is passed through by the visible light selectively.

In some embodiments, the protective layer is adjacent to the visible-light light-emitting diodes, and the transparent substrate is passed through by the ultraviolet light selectively.

In some embodiments, the ultraviolet light assembly includes a plurality of ultraviolet light-emitting diodes two-dimensionally arranged on the second surface and emitting the ultraviolet light selectively.

In some embodiments, the ultraviolet light-emitting diodes are arranged correspondingly to the visible-light light-emitting diodes.

In some embodiments, a first transparent electrode and a second transparent electrode are electrically connected to the transparent substrate, the first transparent electrode is disposed on the first surface and electrically connected to the visible-light light-emitting diodes, and the second transparent electrode is disposed on the second surface and electrically connected to the ultraviolet light-emitting diodes.

In some embodiments, each of the visible-light light-emitting diodes includes a reflecting film, and the reflecting film covers a side surface of the corresponding visible-light light-emitting diode.

In some embodiments, the ultraviolet light assembly includes a plurality of ultraviolet light-emitting diodes and a reflecting layer, the ultraviolet light-emitting diodes are two-dimensionally arranged on the second surface and emit the ultraviolet light selectively, the ultraviolet light-emitting diodes are disposed between the reflecting layer and the transparent substrate, and the reflecting layer reflects the ultraviolet light selectively.

In some embodiments, the reflecting layer includes a plurality of prism structures disposed correspondingly to the ultraviolet light-emitting diodes.

In some embodiments, the ultraviolet light assembly includes a side ultraviolet light source and a light guide layer, the side ultraviolet light source emits the ultraviolet light selectively, and the light guide layer guides the ultraviolet light toward the transparent substrate.

In some embodiments, the side ultraviolet light source includes a plurality of side-emitting diodes or a strip-type side-emitting diode tube.

In some embodiments, the light guide layer includes a plurality of prism structures disposed correspondingly to the visible-light light-emitting diodes.

In some embodiments, a display module is further provided. The display module includes a housing, a protective layer, a transparent substrate, a plurality of visible-light light-emitting diodes, and an ultraviolet light assembly. The protective layer is disposed on the housing. An accommodating space disposed between the housing and the protective layer. The transparent substrate has a first surface and a second surface opposite to each other. The visible-light light-emitting diodes are two-dimensionally disposed on the first surface. The ultraviolet light assembly is disposed on the second surface. The transparent substrate, the visible-light light-emitting diodes, and the ultraviolet light assembly are disposed in the accommodating space, and the ultraviolet light assembly emits an ultraviolet light toward the protective layer.

Detailed features and advantages of the present invention are described in detail below in the implementation, and the content is enough to cause any person familiar with the related art to understand the technical content of the present invention and implement the technical content of the present invention accordingly. In addition, according to the content disclosed in this specification, the scope of the patent application and the accompanying drawings, any person familiar with the related art can easily understand the purpose and advantages of the present invention.

DETAILED DESCRIPTION

Figure 1:
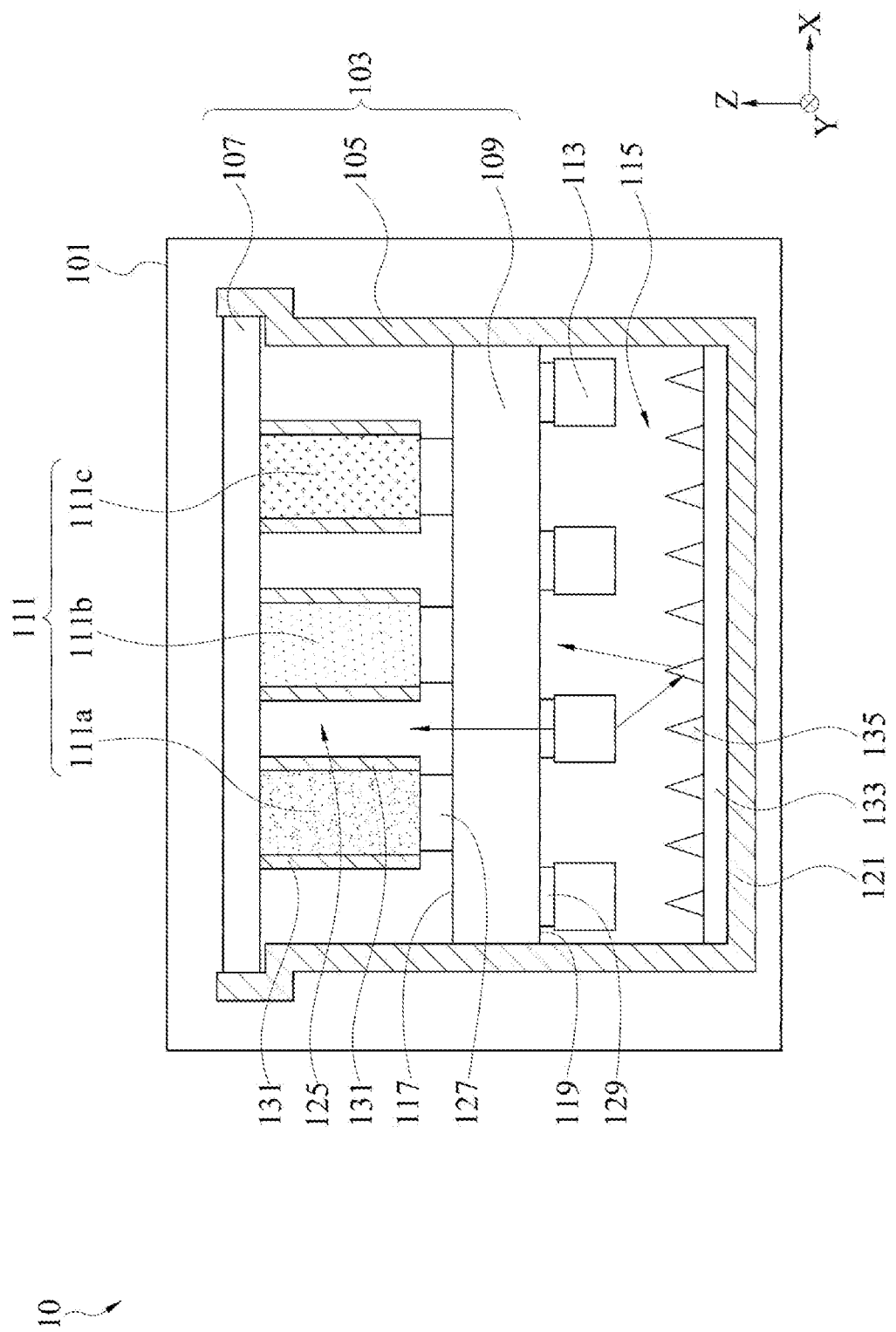
FIG. 1 is a schematic cross-sectional view of an electronic device according to some embodiments of the present invention, showing that a visible-light light-emitting diode is adjacent to a protective layer.

Referring to FIG. 1, FIG. 1 is a schematic cross-sectional view of an electronic device according to some embodiments of the present invention, showing that a visible-light light-emitting diode is adjacent to a protective layer. As shown in FIG. 1, an electronic device 10 with a display module includes a device body 101 and a display module 103. The display module 103 is connected to the device body 101. The display module 103 includes a housing 105, a protective layer 107, a transparent substrate 109, a plurality of visible-light light-emitting diodes 111, and an ultraviolet light assembly 113. The protective layer 107 is disposed on the housing 105. An accommodating space 115 is disposed between the housing and the protective layer. The transparent substrate 109 has a first surface 117 and a second surface 119 opposite to each other. The visible-light light-emitting diodes 111 are two-dimensionally disposed on the first surface 117. The ultraviolet light assembly 113 is disposed on the second surface 119. The transparent substrate 109, the visible-light light-emitting diodes 111, and the ultraviolet light assembly 113 are disposed in the accommodating space 115, and the ultraviolet light assembly emitting an ultraviolet light toward the protective layer 107 selectively.

The electronic device 10 with the display module may be, for example, a mobile phone, a tablet computer, a notebook computer, a screen, a human-machine interface with a computing function, or a touch panel. The device body 101 may include a housing and at least one circuit module of the electronic device 10 with the display module. The housing may be a housing of a mobile phone, a tablet computer, a screen, a human-machine interface with a computing function, or a touch panel, or may include housings that may be closed together, such as a base and a cover plate of a notebook computer (which is described later). The circuit module may include, for example, at least one power module, one sensor, one control circuit, one transmission module, and one communication module (which is described later). The circuit modules are merely examples and the present invention is not limited thereto. In some embodiments, the device body 101 may generate image information selectively, and the image information is displayed through the display module 103 to show an image picture. The display module 103 may be connected to the device body 101 through the housing 105, so that the display module 103 may be partially exposed from the device body 101 for operation by a user or display of the image information. The housing 105 may be directly connected to the device body 101 or indirectly connected to the device body 101. For example, when housing 105 is indirectly connected to device body 101, the housing 105 may be disassembled from and fixed to the device body 101.

The protective layer 107 may be a transparent panel made of, for example, glass, quartz glass, a plastic material (for example, polyethylene terephthalate (PET) or polymethyl methacrylate (PMMA)), so that an ultraviolet light or a visible light can pass through the protective layer 107. For example, after the visible light emitted by the visible-light light-emitting diodes 111 passes through the protective layer 107, the protective layer 107 may display the image picture. After the ultraviolet light emitted by the ultraviolet light assembly 113 passes through the protective layer 107, the ultraviolet light can destroy bacteria or viruses that adhere to the protective layer 107, so as to sterilize and disinfect the protective layer 107. In some embodiments, the above expression "the ultraviolet light assembly emits the ultraviolet light toward the protective layer 107 selectively" may mean that the ultraviolet light assembly 113 may be actuated through control of the device body 101, so that the ultraviolet light assembly 113 emits ultraviolet light and radiates the ultraviolet light toward the protective layer 107 (which is described later). After the protective layer 107 is disposed on the housing 105, the accommodating space 115 may be defined between the housing 105 and the protective layer 107. The transparent substrate 109, the visible-light light-emitting diodes 111, and the ultraviolet light assembly 113 are disposed in the accommodating space 115. In some embodiments, the protective layer 107 may be formed as a plane, a spherical surface, or an arcuate surface. Any implementation allowing the accommodating space 115 to be formed after the protective layer 107 is disposed on the housing 105 may be carried out, and the present invention is not limited to the above.

Figure 1A:
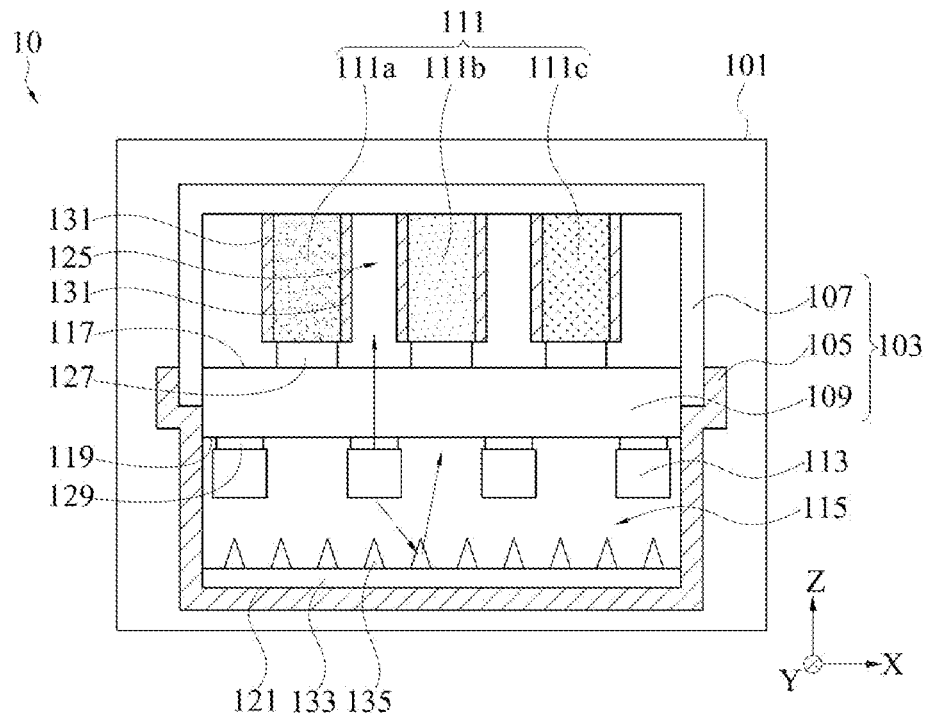
FIG. 1a is a schematic cross-sectional view of an electronic device according to some embodiments of the present invention, showing a display module with a housing and a protective layer both formed as a U shape.
Figure 1B:
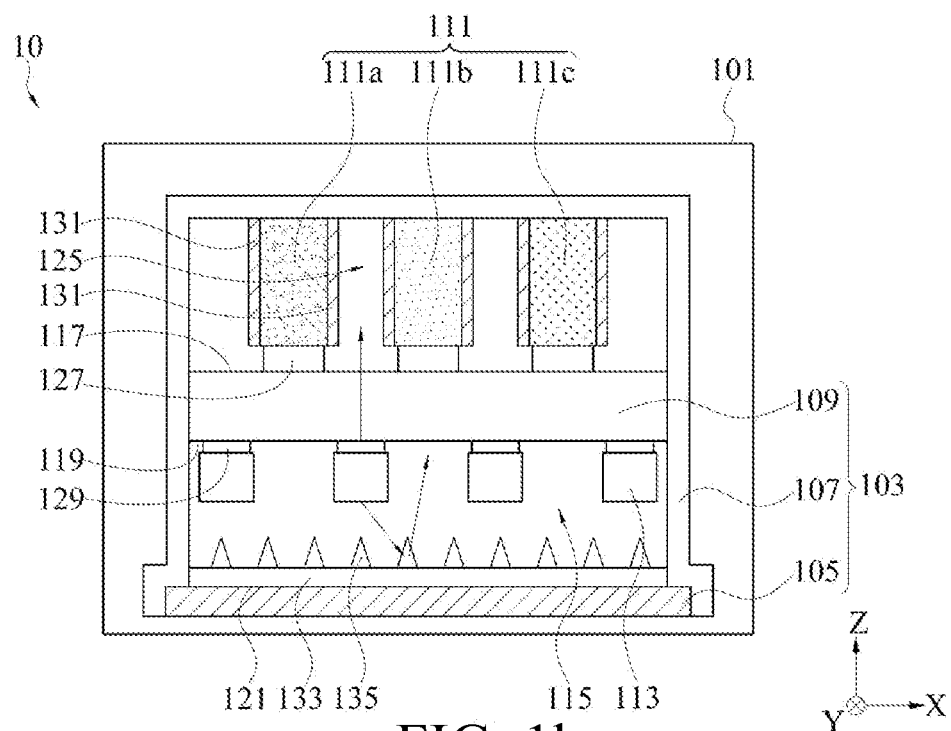
FIG. 1b is a schematic cross-sectional view of an electronic device according to some embodiments of the present invention, showing a display module with a housing formed as a plane and a protective layer formed as a U shape.

Refer to FIG. 1, FIG. 1a, and FIG. 1b. FIG. 1a is a schematic cross-sectional view of an electronic device according to some embodiments of the present invention, showing a display module with a housing and a protective layer both formed as a U shape. FIG. 1b is a schematic cross-sectional view of an electronic device according to some embodiments of the present invention, showing a display module with a housing formed as a plane and a protective layer formed as a U shape. In some embodiments, the above expression "the protective layer 107 is disposed on the housing 105 so that the housing 105 and the protective layer 107 form an accommodating space 115" may be as follows: For example, in the display module 103 shown in FIG. 1, the housing 105 is formed as a U shape and the protective layer 107 is formed as a plane, and the protective layer 107 is connected to the housing 105 to form the accommodating space 115. Alternatively, for example, in the display module 103 shown in FIG. 1a, the housing 105 and the protective layer 107 are both formed as a U shape, and the housing 105 and the protective layer 107 are connected to each other to form the accommodating space 115. Alternatively, for example, in the display module 103 shown in FIG. 1b, the housing 105 is formed as a plane and the protective layer 107 is formed as a U shape, and the protective layer 107 is connected to the housing 105 to form the accommodating space 115. However, the above connection implementations of the housing 105 and the protective layer 107 are merely examples. Any implementation allowing the accommodating space 115 to be formed after the housing 105 and the protective layer 107 are connected to each other may be carried out, and the present invention is not limited to the above connection implementations of the housing 105 and the protective layer 107.

The expression "the transparent substrate 109 is disposed in the accommodating space 115" may mean that the transparent substrate 109 is directly or indirectly fixed to the housing 105 so that the transparent substrate 109 is disposed in the accommodating space 115. The transparent substrate 109 may have a transmittance greater than 70% so that the ultraviolet light or the visible light can pass through the transparent substrate 109.

The visible-light light-emitting diodes 111 each may be, for example, a micro light-emitting diode, an organic light-emitting diode (OLED), or a mini light-emitting diode (mini LED). The visible-light light-emitting diodes 111 emit a visible light selectively, which may mean that the visible-light light-emitting diodes 111 emit the visible light only when actuated (may mean the display module 103 to show the image picture). The visible light emitted by the visible-light light-emitting diodes 111 may have different wavelengths. As shown in FIG. 1, the visible-light light-emitting diodes 111 may include a red light-emitting diode 111a, a green light-emitting diode 111b, and a blue light-emitting diode 111c, so that the visible-light light-emitting diodes 111 may emit a red visible light, a green visible light, or a blue visible light according to a set wavelength. The visible lights having different wavelengths pass through the protective layer 107 to display an image picture. It should be noted that the arrangement of the red light-emitting diode 111a, the green light-emitting diode 111b, and the blue light-emitting diode 111c is merely illustrative. In other embodiments, other arrangements may be presented, so that the electronic device 10 with the display module is applicable to a visible-light light-emitting diode display in all common arrangements.

The ultraviolet light emitted by the ultraviolet light assembly 113 may be a short-wave ultraviolet light (ultra violet C, UVC), and a wavelength of the ultraviolet light emitted by the ultraviolet light assembly 113 ranges from 200 nanometers (nm) to 280 nm. In some embodiments, the ultraviolet light assembly 113 includes a plurality of ultraviolet light-emitting diodes or one ultraviolet lamp tube (which is described later).

In some embodiments, as shown in FIG. 1, the protective layer 107 is adjacent to all of the visible-light light-emitting diodes 111, and the transparent substrate 109 is passed through by the ultraviolet light selectively. Specifically, the first surface 117 of the transparent substrate 109 faces the protective layer 107, so that the visible-light light-emitting diodes 111 disposed on the first surface 117 are adjacent to the protective layer 107. In addition, the second surface 119 of the transparent substrate 109 faces the housing 105, so that the ultraviolet light assembly 113 disposed on the second surface 119 is adjacent to a bottom 121 of the housing 105. In this embodiment, the visible light may follow an irradiation path in which the visible light directly irradiates the protective layer 107, and the ultraviolet light may follow an irradiation path in which the ultraviolet light is reflected from the bottom 121, indirectly passes through the transparent substrate 109, and then irradiates the protective layer 107. In some embodiments, when the ultraviolet light assembly 113 is connected to the transparent substrate 109 through a transparent electrode (which is described later), the ultraviolet light may directly pass through the transparent electrode and the transparent substrate 109, and then irradiate the protective layer 107.

Figure 2:
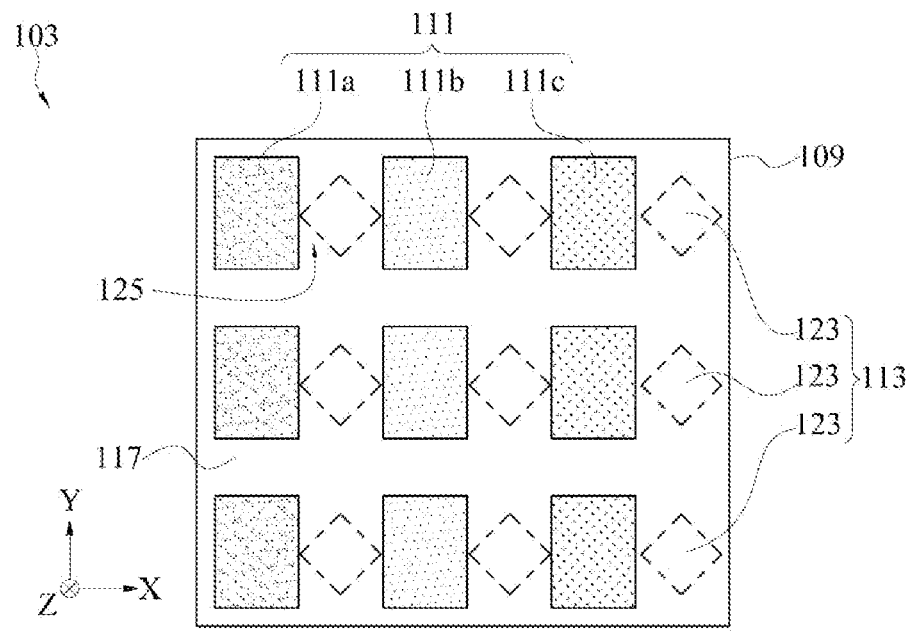
FIG. 2 is a top view of FIG. 1 and illustrates a schematic diagram (I) in which an ultraviolet light assembly and a visible-light light-emitting diode are arranged on a transparent substrate in an array according to some embodiments.
Figure 3:
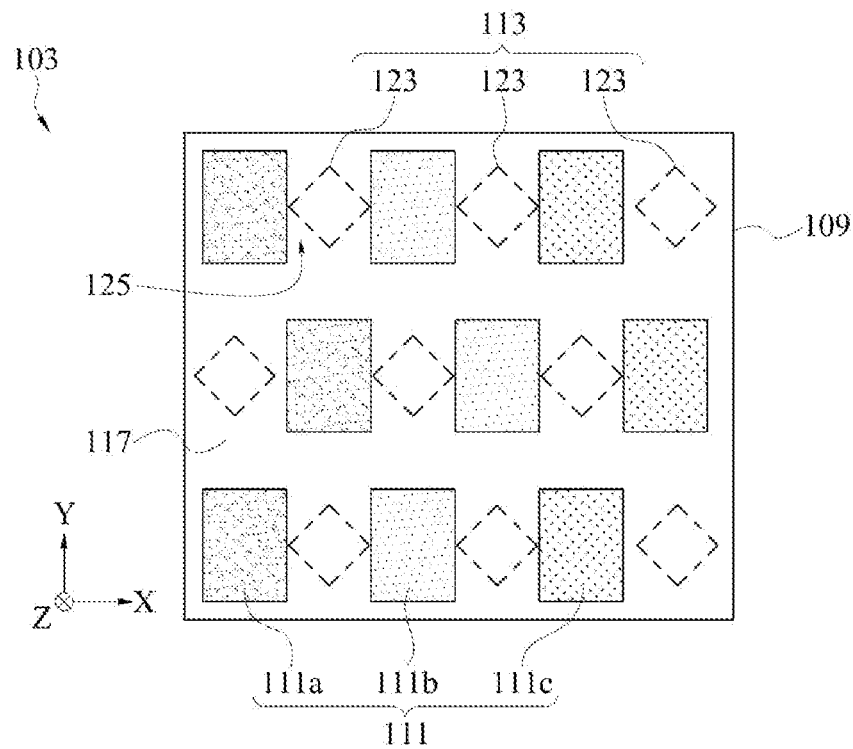
FIG. 3 is a top view of FIG. 1 and illustrates a schematic diagram (I) in which the ultraviolet light assembly and the visible-light light-emitting diode are arranged on the transparent substrate staggered with respect to each other according to some embodiments.
Figure 4:
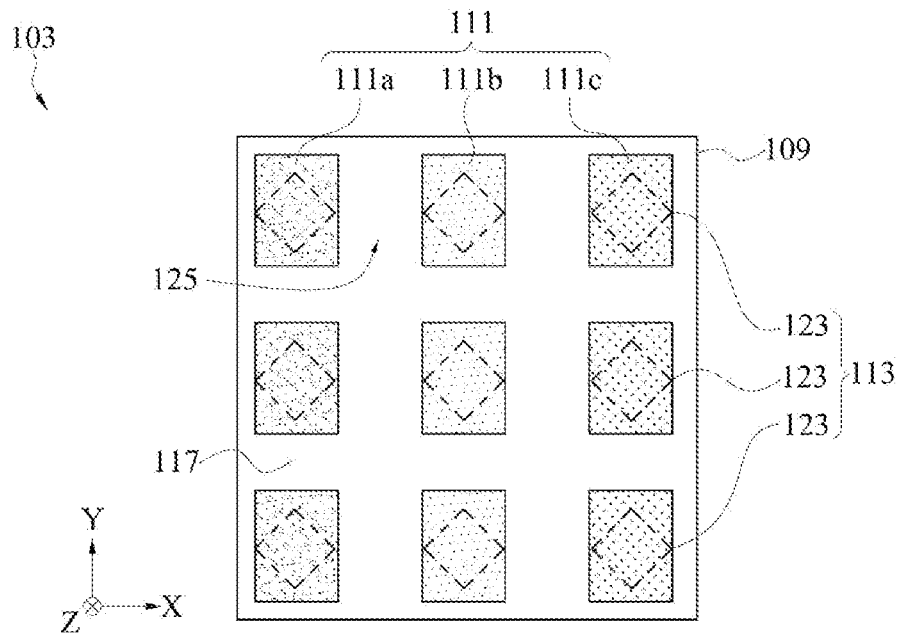
FIG. 4 is a top view of FIG. 1 and illustrates a schematic diagram (II) in which the ultraviolet light assembly and the visible-light light-emitting diode are arranged on the transparent substrate in an array according to some embodiments.
Figure 5:
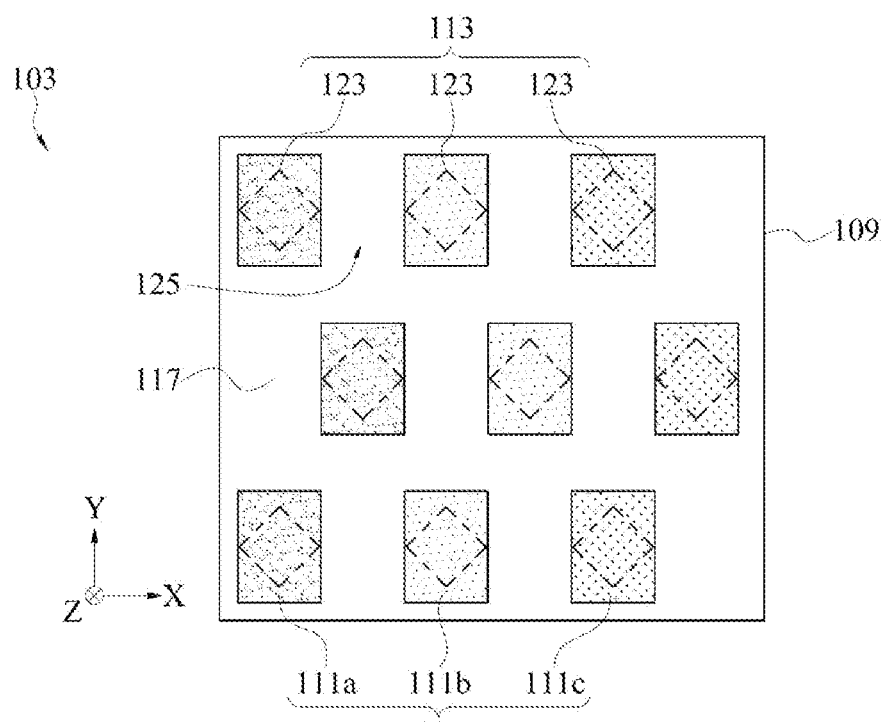
FIG. 5 is a top view of FIG. 1 and illustrates a schematic diagram (II) in which the ultraviolet light assembly and the visible-light light-emitting diode are arranged on the transparent substrate staggered with respect to each other according to some embodiments.

Refer to FIG. 2 to FIG. 5. FIG. 2 is a top view of FIG. 1 and illustrates a schematic diagram (I) in which an ultraviolet light assembly and a visible-light light-emitting diode are arranged on a transparent substrate in an array according to some embodiments. FIG. 3 is a top view of FIG. 1 and illustrates a schematic diagram (I) in which the ultraviolet light assembly and the visible-light light-emitting diode are arranged on the transparent substrate staggered with respect to each other according to some embodiments. FIG. 4 is a top view of FIG. 1 and illustrates a schematic diagram (II) in which the ultraviolet light assembly and the visible-light light-emitting diode are arranged on the transparent substrate in an array according to some embodiments. FIG. 5 is a top view of FIG. 1 and illustrates a schematic diagram (II) in which the ultraviolet light assembly and the visible-light light-emitting diode are arranged on the transparent substrate staggered with respect to each other according to some embodiments. In some embodiments, as shown in FIG. 1 to FIG. 5, the ultraviolet light assembly 113 includes a plurality of ultraviolet light-emitting diodes 123. The visible-light light-emitting diodes 111 are two-dimensionally arranged on the first surface 117 and emit the visible light. All of the ultraviolet light-emitting diodes 123 are two-dimensionally arranged on the second surface 119 (refer to the second surface 119 shown in FIG. 1) and emit the ultraviolet light selectively. In some embodiments, a gap 125 exists between two adjacent visible-light light-emitting diodes 111. The ultraviolet light emitted by the ultraviolet light assembly 113 can pass through the transparent substrate 109 and irradiates the protective layer 107 through the gap 125. The foregoing two-dimensional arrangement may be an array arrangement or a staggered arrangement.

For example, for the array arrangement, refer to FIG. 2 or FIG. 4. In some embodiments, as shown in FIG. 2, the two adjacent visible-light light-emitting diodes 111 are arranged on the first surface 117 in an array at an equal interval, and all of the ultraviolet light-emitting diodes 123 are arranged on the second surface 119 in an array at an equal interval. The expression "all of the visible-light light-emitting diodes 111 are respectively staggered with respect to all of the ultraviolet light-emitting diodes 123" may mean that the visible-light light-emitting diodes 111 and all of the ultraviolet light-emitting diodes 123 are not on the same axis (an axis in a Z-axis direction in FIG. 2), or may mean that each of the ultraviolet light-emitting diodes 123 corresponds to the gap 125. Each of the ultraviolet light-emitting diodes 123 may correspond to a part of the gap 125, so that the ultraviolet light may directly or indirectly pass through the transparent substrate 109 through another part of the gap 125.

In some embodiments, as shown in FIG. 4, two adjacent visible-light light-emitting diodes 111 are arranged on the first surface 117 in an array at an equal interval. Likewise, all of the ultraviolet light-emitting diodes 123 are arranged on the second surface 119 in an array of at an equal interval (refer to the second surface 119 shown in FIG. 1). All of the visible-light light-emitting diodes 111 and all of the ultraviolet light-emitting diodes 123 are substantially disposed on the same axis (an axis in a Z-axis direction in FIG. 4), so that the ultraviolet light may directly or indirectly pass through the transparent substrate 109 through the gap 125. For foregoing staggered arrangement, refer to FIG. 3 or FIG. 5.

In some embodiments, as shown in FIG. 3, two adjacent rows of visible-light light-emitting diodes 111 are arranged on the first surface 117 staggered with respect to each other, and two adjacent rows of ultraviolet light-emitting diodes 123 are arranged on the second surface 119 staggered with respect to each other (refer to the second surface 119 in FIG. 1). The expression "all of the visible-light light-emitting diodes 111 are respectively staggered with respect to all of the ultraviolet light-emitting diodes 123" may mean that the visible-light light-emitting diodes 111 and all of the ultraviolet light-emitting diodes 123 are not on the same axis (an axis in a Z-axis direction in FIG. 3), may mean that each of the ultraviolet light-emitting diodes 123 corresponds to the gap 125. Each of the ultraviolet light-emitting diodes 123 may correspond to a part of the gap 125, so that the ultraviolet light may directly or indirectly pass through the transparent substrate 109 through another part of the gap 125.

In some embodiments, as shown in FIG. 5, two adjacent rows of visible-light light-emitting diodes 111 are arranged on the first surface 117 staggered with respect to each other, and two adjacent rows of ultraviolet light-emitting diodes 123 are arranged on the second surface 119 staggered with respect to each other (refer to the second surface 119 in FIG. 1). The visible-light light-emitting diodes 111 and the ultraviolet light-emitting diodes 123 facing each other are substantially disposed on the same axis (an axis in a Z-axis direction in FIG. 5), so that the ultraviolet light may directly or indirectly pass through the transparent substrate 109 through the gap 125.

In some embodiments, as shown in FIG. 1, a first transparent electrode 127 and a second transparent electrode 129 are electrically connected to the transparent substrate 109. The first transparent electrode 127 is disposed on the first surface 117 and electrically connected to each of the visible-light light-emitting diodes 111. The second transparent electrode 129 is disposed on the second surface 119 and electrically connected to each of the ultraviolet light-emitting diodes 123. Specifically, the first transparent electrode 127 and the second transparent electrode 129 are electrically connected to the transparent substrate 109 and a control circuit of the device body 101 (which is described later), so that the control circuit can control light emission of the visible-light light-emitting diode 111 or the ultraviolet light-emitting diode 123. A material of first transparent electrode 127 or the second transparent electrode 129 includes a metal oxide, such as an indium tin oxide, an indium zinc oxide, an aluminum tin oxide, an aluminum zinc oxide, an indium gallium zinc oxide, or a stacked layer of at least two of the above.

In some embodiments, as shown in FIG. 1, each of the visible-light light-emitting diodes 111 includes a reflecting film 131, and the reflecting film 131 covers a side surface of the corresponding visible-light light-emitting diode 111. The reflecting film 131 may reflect or refract the ultraviolet light. When the ultraviolet light irradiates the visible-light light-emitting diode 111, the reflecting film 131 may reflect or refract the ultraviolet light, so that a part of the ultraviolet light that irradiates the reflecting film 131 may be reflected or refracted to the protective layer 107 by the reflecting film 131, thereby increasing an amount of the ultraviolet light that irradiates the protective layer 107.

In some embodiments, as shown in FIG. 1, the ultraviolet light assembly 113 further includes a reflecting layer 133. The reflecting layer 133 may be coated, welded, or glued to the housing 105, and all of the ultraviolet light-emitting diodes 123 are disposed between the reflecting layer 133 and the transparent substrate 109. The reflecting layer 133 reflects the ultraviolet light selectively. For example, after the ultraviolet light-emitting diode 123 emits the ultraviolet light, a part of the ultraviolet light irradiates the reflecting layer 133, and the reflecting layer 133 reflects the ultraviolet light to the transparent substrate 109. Specifically, after the part of the ultraviolet light is reflected once by the reflecting layer 133, the ultraviolet light passes through the gap 125 (the gap 125 shown in FIG. 2 to FIG. 5), so that the part of the ultraviolet light may pass through the transparent substrate 109 and irradiate the protective layer 107. Another part of the ultraviolet light may directly pass through the second transparent electrode 129 and the transparent substrate 109 and irradiate the protective layer 107.

In some embodiments, as shown in FIG. 1, the reflecting layer 133 includes a plurality of prism structures 135, and each of the prism structures 135 corresponds to each of the ultraviolet light-emitting diodes 123. Specifically, the prism structure 135 refracts the ultraviolet light selectively. For example, the ultraviolet light-emitting diodes 123 emit the ultraviolet light toward the reflecting layer 133. A part of the ultraviolet light irradiates the prism structure 135, and the prism structure 135 may refract the ultraviolet light to the transparent substrate 109, so that the ultraviolet light irradiates the protective layer 107 through the gap 125. The prism structure 135 may be coated to the reflecting layer 133, or may be directly formed on the reflecting layer 133.

Figure 6:
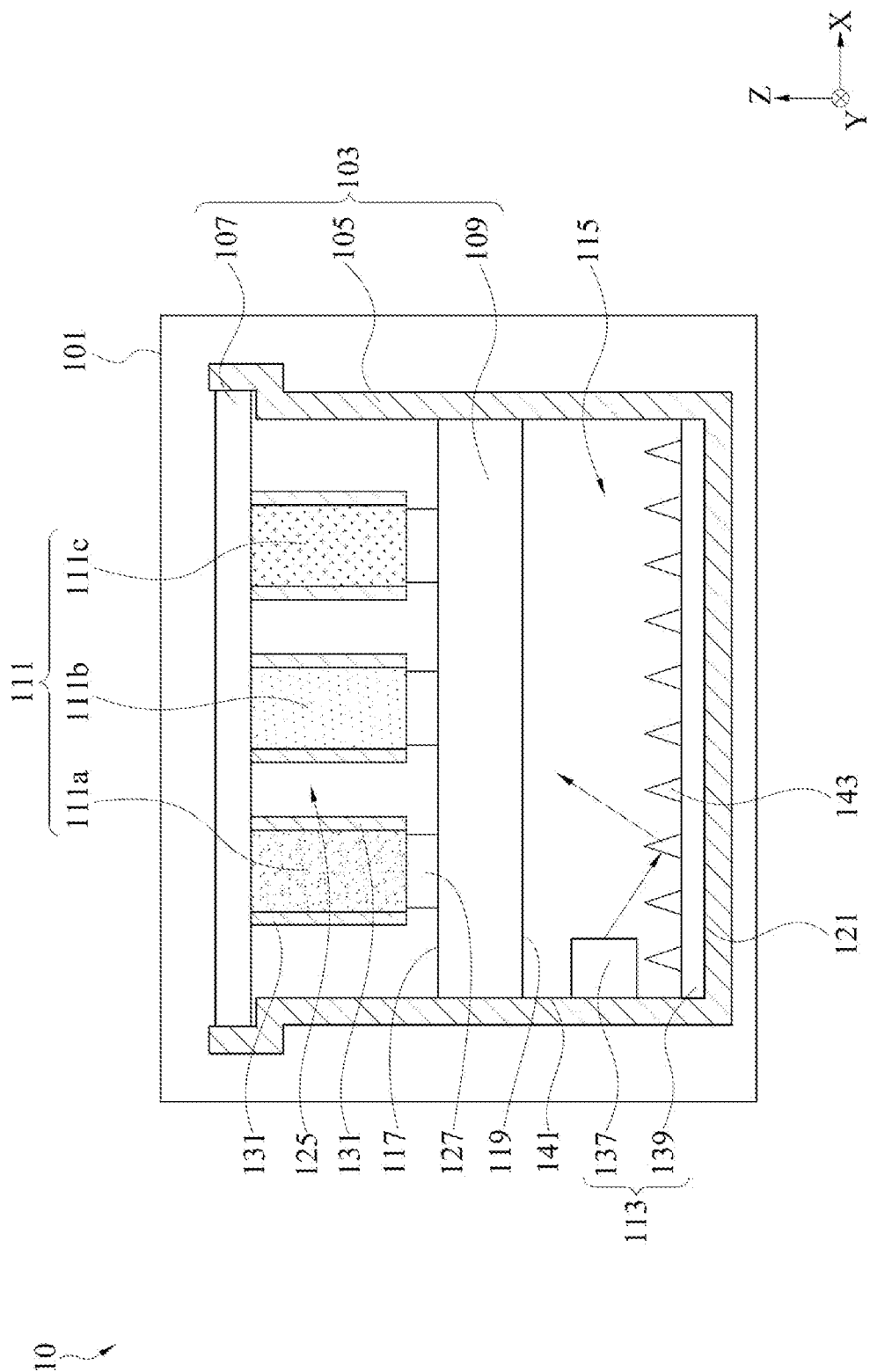
FIG. 6 is a schematic diagram of the visible-light light-emitting diode adjacent to the protective layer according to some embodiments of the present invention, showing a position of a side ultraviolet light source.

Referring to FIG. 6, FIG. 6 is a schematic diagram of the visible-light light-emitting diode adjacent to the protective layer according to some embodiments of the present invention, showing a position of a side ultraviolet light source. In some embodiments, the ultraviolet light assembly 113 includes a side ultraviolet light source 137 and a light guide layer 139. The side ultraviolet light source 137 emits the ultraviolet light. The light guide layer 139 guides the ultraviolet light toward the transparent substrate 109. Specifically, the side ultraviolet light source 137 is disposed at the bottom 121 or a side 141 of the housing 105, and the light guide layer 139 is arranged at the bottom 121 of the housing 105, so that the side ultraviolet light source 137 can irradiate the ultraviolet light on the light guide layer 139 from a side, and the light guide layer 139 can guide the ultraviolet light to the transparent substrate 109. In some embodiments, the side ultraviolet light source 137 may include, for example, a plurality of side-emitting diodes or a strip-type side-emitting diode tube.

In some embodiments, as shown in FIG. 6, the light guide layer 139 includes a plurality of prism structures 143, and each of the prism structures corresponds to each of the visible-light light-emitting diodes 111. Specifically, the prism structure 143 refracts the ultraviolet light selectively. For example, the side ultraviolet light source 137 emits the ultraviolet light toward the light guide layer 139. A part of the ultraviolet light irradiates the prism structure 143, and the prism structure 143 may guide the ultraviolet light to be refracted to the transparent substrate 109, so that the ultraviolet light irradiates the protective layer 107 through the gap 125. The prism structure 143 may be coated to the light guide layer 139, or may be directly formed on the light guide layer 139.

Figure 7:
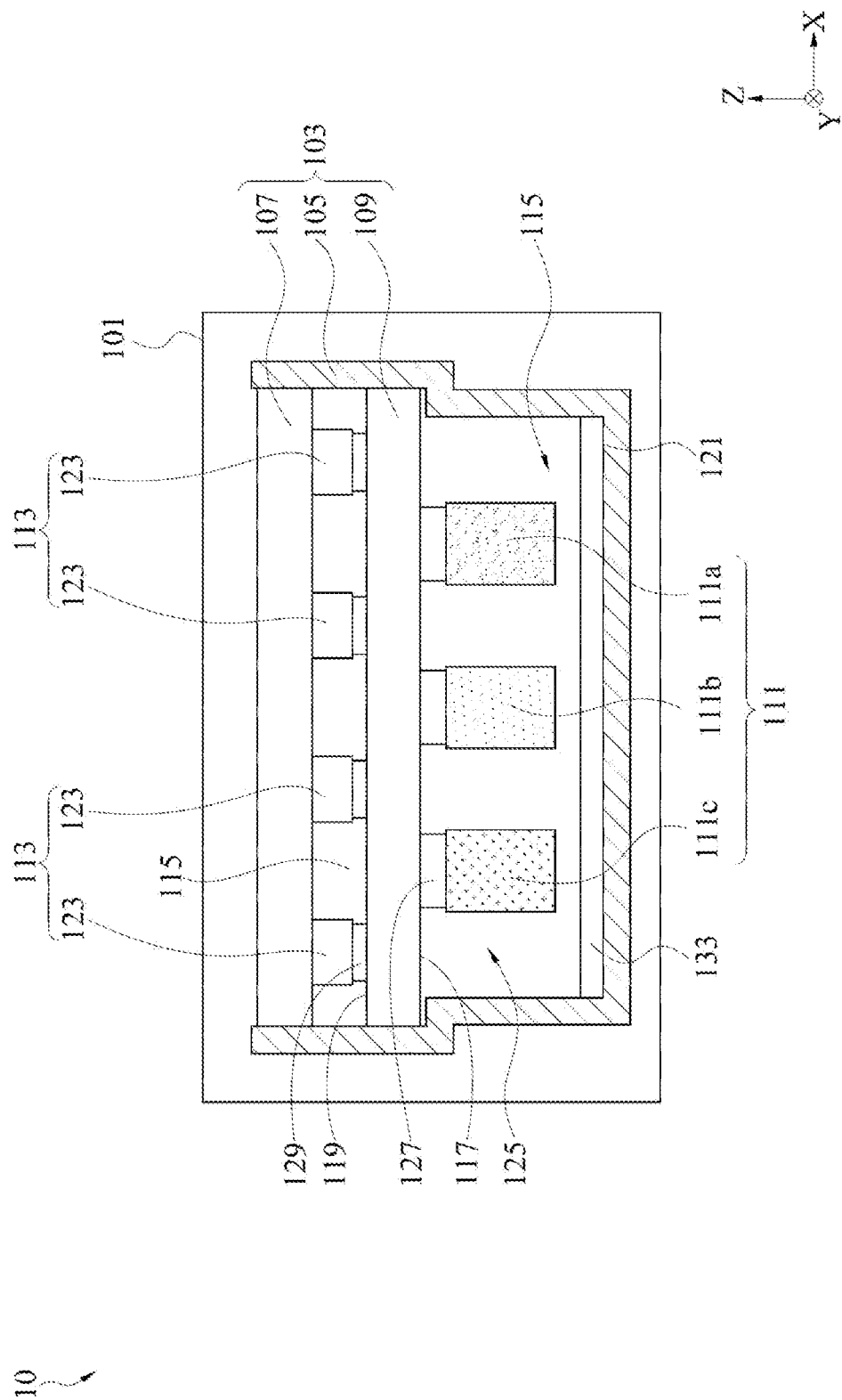
FIG. 7 is a schematic cross-sectional view of the electronic device according to some embodiments of the present invention, showing that the ultraviolet light assembly is adjacent to the protective layer.

Referring to FIG. 7, FIG. 7 is a schematic cross-sectional view of the electronic device according to some embodiments of the present invention, showing that the ultraviolet light assembly is adjacent to the protective layer. In some embodiments, the protective layer 107 is adjacent to the ultraviolet light assembly 113, and the transparent substrate 109 is passed through by the visible light selectively. Specifically, the first surface 117 of the transparent substrate 109 corresponds to the bottom 121 of the housing 105, so that the visible-light light-emitting diodes 111 disposed on the first surface 117 are adjacent to the bottom 121 of the housing 105. In addition, the second surface 119 of the transparent substrate 109 corresponds to the protective layer 107, so that the ultraviolet light assembly 113 disposed on the second surface 119 is adjacent to the protective layer 107. In this embodiment, the ultraviolet light may follow an irradiation path in which the ultraviolet light directly irradiates the protective layer 107. The visible light may follow an irradiation path in which the visible light is reflected from the bottom 121 of the housing 105, passes through the transparent substrate 109, and then irradiates the protective layer 107. In some embodiments, as shown in FIG. 7, a first transparent electrode 127 and a second transparent electrode 129 are electrically connected to the transparent substrate 109. The first transparent electrode 127 is disposed on the first surface 117 and electrically connected to each of the visible-light light-emitting diodes 111. The second transparent electrode 129 is disposed on the second surface 119 and electrically connected to each of the ultraviolet light-emitting diodes 123. Therefore, when the visible-light light-emitting diode 111 is connected to the transparent substrate 109 through the first transparent electrode 127, the visible light can directly or indirectly pass through the transparent electrode and the transparent substrate 109, and then irradiate the protective layer 107.

As shown in FIG. 7, in some embodiments, the visible-light light-emitting diodes 111 are disposed between the reflecting layer 133 and the transparent substrate 109, so that the reflecting layer 133 can reflect the visible light to guide the visible light to pass through the transparent substrate 109 and irradiate the protective layer 107, thereby displaying an image picture. It should be noted that after the visible light is reflected once by the reflecting layer 133, the visible light can still have a proper light intensity, so that the image picture can be clearly displayed. In addition, in order to prevent the ultraviolet light assembly 113 from shielding the visible light, a quantity of ultraviolet light assemblies 113 may be reduced provided that visible light imaging is not affected and the demand for sterilization is satisfied. In this embodiment, for arrangements of the visible-light light-emitting diodes 111 and the ultraviolet light assembly 113 on the transparent substrate 109, refer to FIG. 2 to FIG. 5. The only difference is the different locations of the visible-light light-emitting diodes 111 and the ultraviolet light assembly 113. Therefore, the details are not repeated. In some embodiments, the visible light emitted by the visible-light light-emitting diodes 111 may be directly reflected from the bottom 121 of the housing 105 without using the reflecting layer 133.

Figure 8:
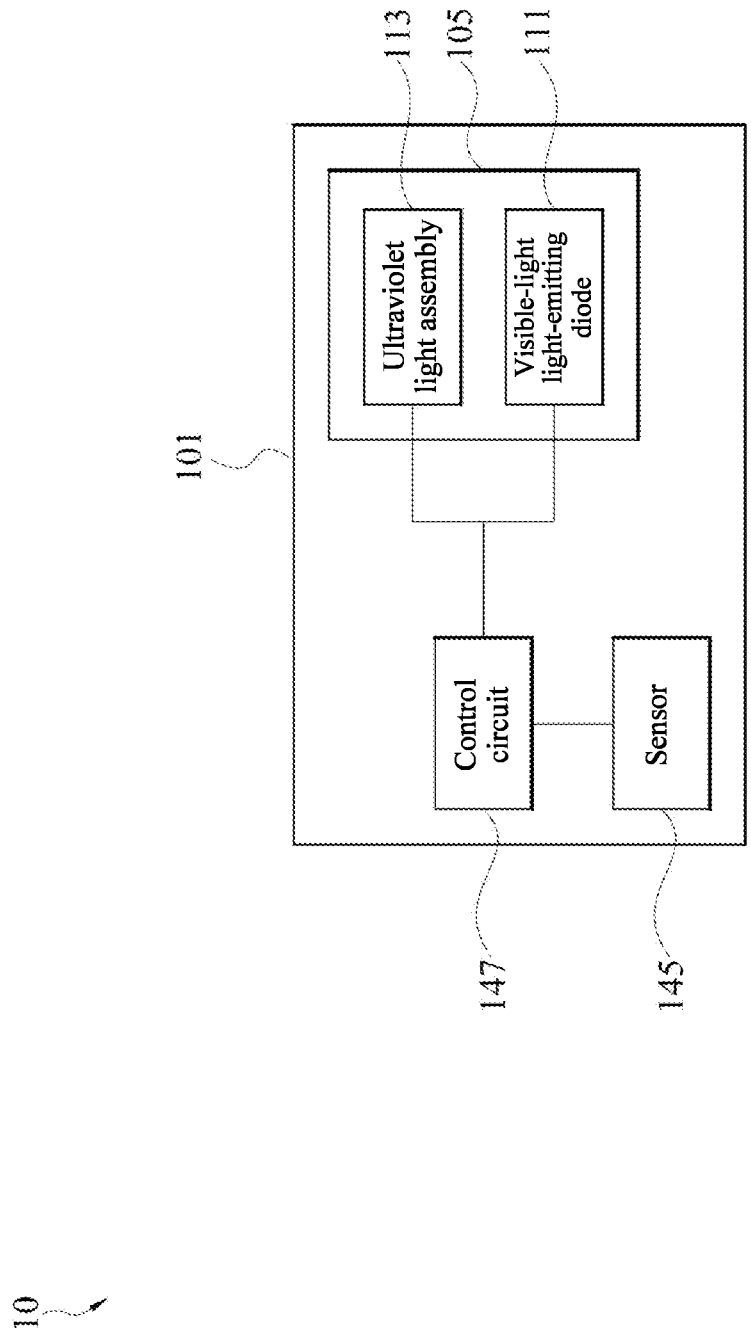
FIG. 8 is a block diagram of the electronic device according to some embodiments of the present invention.

Referring to FIG. 8, FIG. 8 is a block diagram of the electronic device according to some embodiments of the present invention. As shown in FIG. 8, in some embodiments, the device body 101 further includes a sensor 145 and a control circuit 147. The sensor 145 is connected to the device body 101 to generate a trigger signal. The control circuit 147 may receive the image information, and control the visible-light light-emitting diodes 111 to operate according to the image information, so as to display the image picture, and the control circuit 147 further generates a control signal according to the trigger signal selectively. The ultraviolet light assembly 113 controls emission of the ultraviolet light according to the control signal. Specifically, the sensor 145 may detect whether a target (for example, a human body or an object) is in a detection range after the sensor 145 is connected to device body 101. When the sensor 145 detects the target within the detection range, the sensor 145 may generate a trigger signal, so that the control circuit 147 receives the trigger signal and transmits a control signal. In some embodiments, the sensor 145 may be an infrared sensor, a laser sensor, and an ultrasonic sensor, or a combination of two or more of the sensors.

In some embodiments, as shown in FIG. 1 to FIG. 8, the control signal includes an on signal and an off signal. After the control circuit 147 receives the trigger signal, the control circuit 147 generates the off signal or the on signal, so that the ultraviolet light assembly 113 stops emitting the ultraviolet light according to the off signal, or emits the ultraviolet light according to the on signal. For example, the device body 101 may be a touch screen, and the sensor 145 may be connected to a housing of the touch screen. When the sensor 145 detects the target (for example, a human body) within the detection range, the sensor 145 may continuously transmit the trigger signal. The control circuit 147 generates the off signal after receiving the trigger signal, so that the ultraviolet light assembly 113 stops emitting the ultraviolet light based on the off signal. When the target is far away from the detection range, the sensor 145 stops transmitting the trigger signal, and the control circuit 147 may generate an on signal when receiving no trigger signal, so that the ultraviolet light assembly 113 emits the ultraviolet light again according to the on signal.

In some embodiments, as shown in FIG. 1 to FIG. 8, the control circuit 147 may set a trigger distance. When the control circuit 147 detects that the target enters the detection range and is at a distance less than or equal to the trigger distance, the control circuit 147 transmits the control signal. Alternatively, when the control circuit 147 receives the trigger signal, the control circuit 147 generates the on signal. A notebook computer is used as another example. The device body 101 may be a notebook computer, and the sensor 145 may be disposed in a housing of the notebook computer (for example, disposed on a base). When the sensor 145 detects a cover plate in a detection range (that is to say, the cover plate is closed toward the base), the sensor 145 may continuously transmit the trigger signal. The control circuit 147 generates the on signal after receiving the trigger signal, so that the ultraviolet light assembly 113 emits the ultraviolet light according to the on signal. When the sensor 145 detects no cover plate within the detection range (that is to say, the cover plate is opened away from the base), the sensor 145 stops transmitting the trigger signal, and the control circuit 147 may generate the off signal when receiving no trigger signal, so that the ultraviolet light assembly 113 stops emitting the ultraviolet light according to the off signal.

In some embodiments, as shown in FIG. 1 to FIG. 8, the control circuit 147 may set an operating time. The control circuit 147 generates the control signal according to the operating time. The control circuit 147 may set a specified time period or a time interval for generating the control signal, so that the control circuit 147 turns on or off the ultraviolet light assembly 113 at a specific time. For example, when the user sets the operating time to disinfection every thirty minutes, the control circuit 147 turns on the ultraviolet light assembly 113 for a preset time in a specified time period every thirty minutes. When the ultraviolet light assembly 113 is on for the preset time, the control circuit 147 turns off the ultraviolet light assembly 113. For example, if the user sets the operating time to disinfection from 10:00 p.m. to 11:00 p.m., the control circuit 147 turns on the ultraviolet light assembly 113 at 10:00 p.m. and turns off the ultraviolet light assembly 113 at 11:00 p.m. Therefore, the control circuit 147 can turn on the ultraviolet light regularly, which realizes automatic sterilization.

Based on the above, in some embodiments of the present invention, the electronic device 10 with a display module is provided. The visible-light light-emitting diode 111 and the ultraviolet light assembly 113 are respectively disposed on the first surface 117 and the second surface 119 of the transparent substrate 109. When the visible-light light-emitting diode 111 is not actuated (that is, no image picture is displayed), the ultraviolet light assembly 113 may irradiate the ultraviolet light on the protective layer 107 to disinfect and sterilize the protective layer 107. In some embodiments, the control circuit 147 may control the ultraviolet light assembly 113 so that the ultraviolet light assembly 113 can disinfect and sterilize the protective layer 107 at the specific time.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An electronic device with a display module, comprising:
   a device body; and
   a display module, connected to the device body and comprising:
   a housing;
   a protective layer, disposed on the housing;
   an accommodating space disposed between the housing and the protective layer;
   a transparent substrate, having a first surface and a second surface opposite to each other;
   a plurality of visible-light light-emitting diodes two-dimensionally disposed on the first surface; and
   an ultraviolet light assembly, disposed on the second surface, wherein
   the transparent substrate, the visible-light light-emitting diodes, and the ultraviolet light assembly are disposed in the accommodating space, and the ultraviolet light assembly emits an ultraviolet light toward the protective layer selectively.

2. The electronic device with a display module according to claim 1, wherein the protective layer is adjacent to the ultraviolet light assembly, the visible-light light-emitting diodes emit a visible light selectively, and the transparent substrate is passed through by the visible light selectively.

3. The electronic device with a display module according to claim 1, wherein the protective layer is adjacent to the visible-light light-emitting diodes, and the transparent substrate is passed through by the ultraviolet light selectively.

4. The electronic device with a display module according to claim 3, wherein the ultraviolet light assembly comprises a plurality of ultraviolet light-emitting diodes two-dimensionally arranged on the second surface and emitting the ultraviolet light selectively.

5. The electronic device with a display module according to claim 4, wherein the ultraviolet light-emitting diodes are arranged correspondingly to the visible-light light-emitting diodes.

6. The electronic device with a display module according to claim 5, wherein a first transparent electrode and a second transparent electrode are electrically connected to the transparent substrate, the first transparent electrode is disposed on the first surface and electrically connected to the visible-light light-emitting diodes, and the second transparent electrode is disposed on the second surface and electrically connected to the ultraviolet light-emitting diodes.

7. The electronic device with a display module according to claim 3, wherein the ultraviolet light assembly comprises a plurality of ultraviolet light-emitting diodes and a reflecting layer, the ultraviolet light-emitting diodes are two-dimensionally arranged on the second surface and emitting the ultraviolet light selectively, the ultraviolet light-emitting diodes are disposed between the reflecting layer and the transparent substrate, and the reflecting layer reflecting the ultraviolet light selectively.

8. The electronic device with a display module according to claim 7, wherein the reflecting layer comprises a plurality of prism structures disposed correspondingly to the ultraviolet light-emitting diodes.

9. The electronic device with a display module according to claim 1, wherein each of the visible-light light-emitting diodes comprises a reflecting film, and the reflecting film covers a side surface of the corresponding visible-light light-emitting diode.

10. The electronic device with a display module according to claim 3, wherein the ultraviolet light assembly comprises a side ultraviolet light source and a light guide layer, the side ultraviolet light source emits the ultraviolet light selectively, and the light guide layer guides the ultraviolet light toward the transparent substrate.

11. The electronic device with a display module according to claim 10, wherein the side ultraviolet light source comprises a plurality of side-emitting diodes or a strip-type side-emitting diode tube.

12. The electronic device with a display module according to claim 10, wherein the light guide layer comprises a plurality of prism structures disposed between the light guide layer and the transparent substrate.

13. A display module, comprising:
   a housing;
   a protective layer, disposed on the housing;
   an accommodating space disposed between the housing and the protective layer;
   a transparent substrate, having a first surface and a second surface opposite to each other;
   a plurality of visible-light light-emitting diodes two-dimensionally disposed on the first surface; and
   an ultraviolet light assembly, disposed on the second surface, wherein
   the transparent substrate, the visible-light light-emitting diodes, and the ultraviolet light assembly are disposed in the accommodating space, and the ultraviolet light assembly emitting an ultraviolet light toward the protective layer selectively.

14. The display module according to claim 13, wherein the protective layer is adjacent to the ultraviolet light assembly, the visible-light light-emitting diodes emit a visible light selectively, the transparent substrate is passed through by the visible light selectively, and the ultraviolet light assembly comprises a plurality of ultraviolet light-emitting diodes two-dimensionally arranged on the second surface and emitting the ultraviolet light selectively.

15. The display module according to claim 13, wherein the protective layer is adjacent to the visible-light light-emitting diodes, the transparent substrate is passed through by the ultraviolet light selectively, and the ultraviolet light assembly comprises a plurality of ultraviolet light-emitting diodes two-dimensionally arranged on the second surface and emit the ultraviolet light selectively.

16. The display module according to claim 15, wherein the ultraviolet light-emitting diodes are arranged correspondingly to the visible-light light-emitting diodes, a first transparent electrode and a second transparent electrode are electrically connected to the transparent substrate, the first transparent electrode is disposed on the first surface and electrically connected to the visible-light light-emitting diodes, the second transparent electrode is disposed on the second surface and electrically connected to the ultraviolet light-emitting diodes, each of the visible-light light-emitting diodes comprises a reflecting film, and the reflecting film covers a side surface of the corresponding visible-light light-emitting diode.

17. The display module according to claim 15, wherein the ultraviolet light assembly comprises a plurality of ultraviolet light-emitting diodes and a reflecting layer, the ultraviolet light-emitting diodes are two-dimensionally arranged on the second surface and emit the ultraviolet light selectively, the ultraviolet light-emitting diodes are disposed between the reflecting layer and the transparent substrate, and the reflecting layer reflects the ultraviolet light selectively.

18. The display module according to claim 17, wherein the reflecting layer comprises prism structures disposed correspondingly to the ultraviolet light-emitting diodes.

19. The display module according to claim 15, wherein the ultraviolet light assembly comprises a side ultraviolet light source and a light guide layer, the side ultraviolet light source emits the ultraviolet light selectively, the light guide layer guides the ultraviolet light toward the transparent substrate, and the light guide layer comprises a plurality of prism structures disposed between the light guide layer and the transparent substrate.

20. The display module according to claim 19, wherein the side ultraviolet light source comprises a plurality of side-emitting diodes or a strip-type side-emitting diode tube.

* * * * *